United States Patent
Selwyn

(10) Patent No.: US 9,902,874 B2
(45) Date of Patent: Feb. 27, 2018

(54) HYPERBARIC PROCESS FOR APPLYING AND CURING AN ORGANIC POLYMERIZABLE TREATMENT

(71) Applicant: Gary S. Selwyn, Albuquerque, NM (US)

(72) Inventor: Gary S. Selwyn, Albuquerque, NM (US)

( * ) Notice: Subject to any disclaimer, the term of this patent is extended or adjusted under 35 U.S.C. 154(b) by 25 days.

(21) Appl. No.: 15/225,739

(22) Filed: Aug. 1, 2016

(65) Prior Publication Data
US 2017/0029663 A1     Feb. 2, 2017

Related U.S. Application Data

(60) Provisional application No. 62/199,195, filed on Jul. 30, 2015.

(51) Int. Cl.
| | | |
|---|---|---|
| C09D 183/04 | (2006.01) |
| C08J 7/04 | (2006.01) |
| B05D 3/00 | (2006.01) |
| D06M 11/34 | (2006.01) |
| D06M 14/02 | (2006.01) |
| D06M 14/08 | (2006.01) |
| D06M 15/263 | (2006.01) |
| D06M 15/643 | (2006.01) |
| D06M 15/705 | (2006.01) |
| H01L 21/56 | (2006.01) |
| B01D 61/00 | (2006.01) |
| B05D 3/04 | (2006.01) |
| B05D 3/02 | (2006.01) |

(52) U.S. Cl.
CPC .......... *C09D 183/04* (2013.01); *B01D 61/00* (2013.01); *B05D 3/007* (2013.01); *C08J 7/04* (2013.01); *D06M 11/34* (2013.01); *D06M 14/02* (2013.01); *D06M 14/08* (2013.01); *D06M 15/263* (2013.01); *D06M 15/643* (2013.01); *D06M 15/705* (2013.01); *H01L 21/56* (2013.01); *B05D 3/0254* (2013.01); *B05D 3/0486* (2013.01); *C08J 2383/04* (2013.01); *C08J 2433/08* (2013.01); *D06M 2200/12* (2013.01)

(58) Field of Classification Search
None
See application file for complete search history.

(56) References Cited

U.S. PATENT DOCUMENTS 3,449,061 A * 6/1969 Cain .................. D06M 13/248
                                                          28/169

* cited by examiner

*Primary Examiner* — Erma C Cameron

(57) ABSTRACT

Substrates are coated with a curable composition that includes at least one free radical polymerizable monomer and a heat-activated polymerization initiator. The coating is applied to the substrate and cured thereon to produce the coating. Curing is performed by purging molecular air from the vessel containing the substrate, pressuring with an oxygen-deficient gas and then curing the fabric in the oxygen-deficient gas at elevated pressure and temperature.

16 Claims, 3 Drawing Sheets

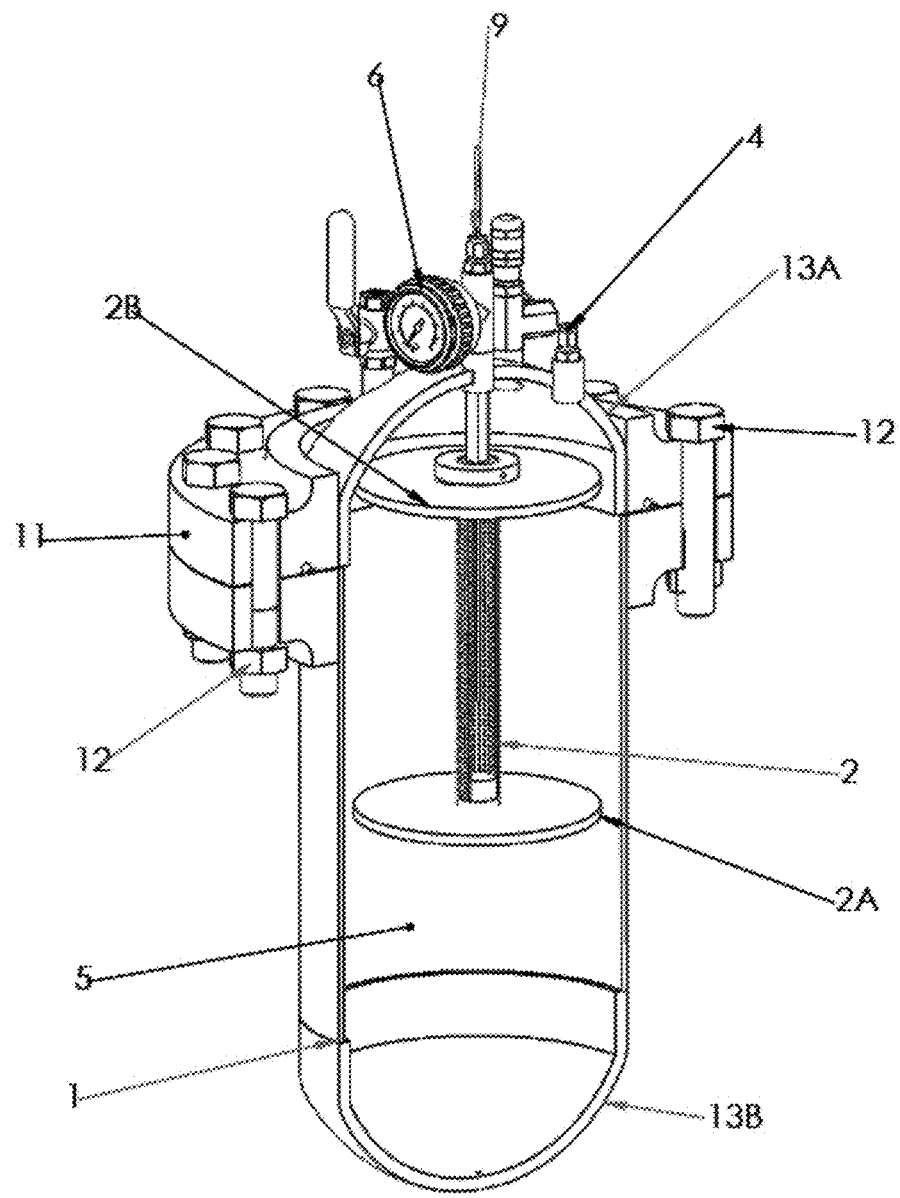

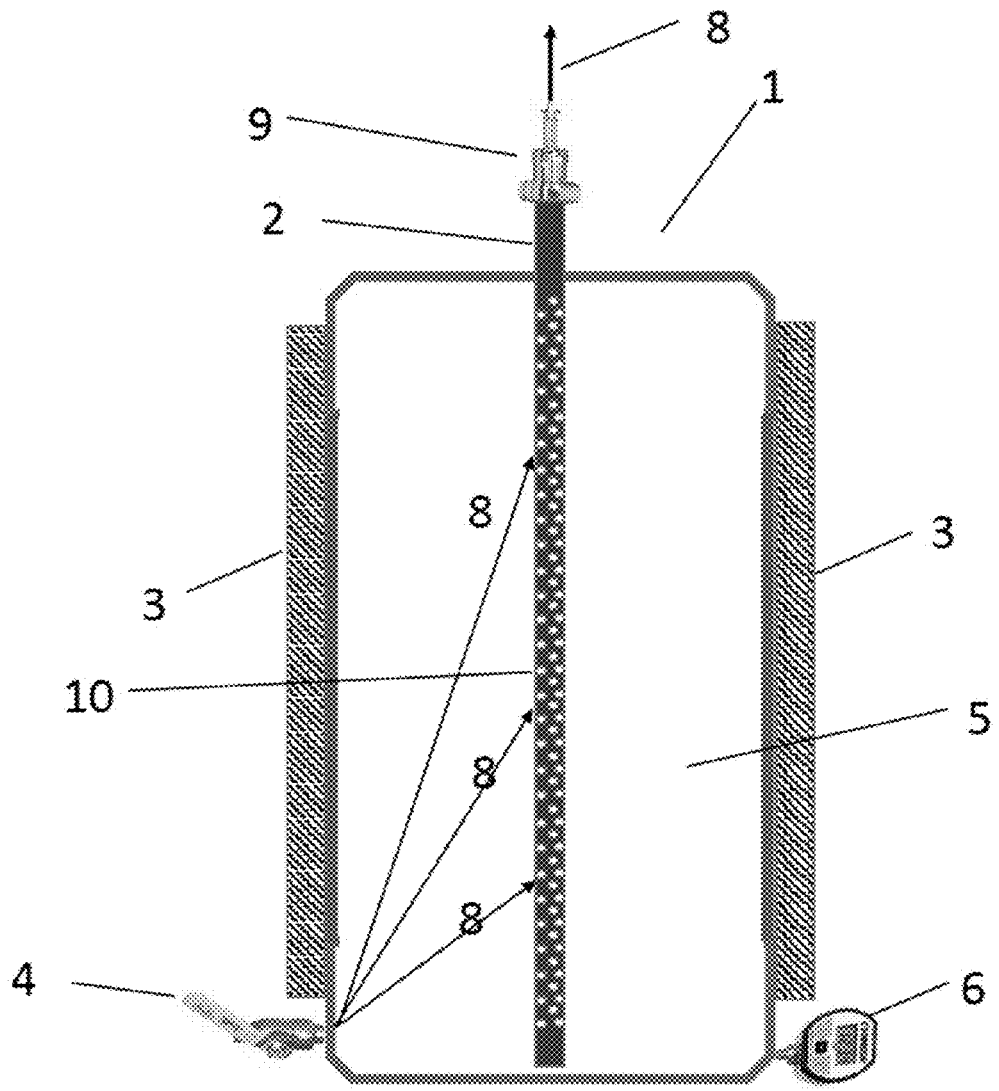

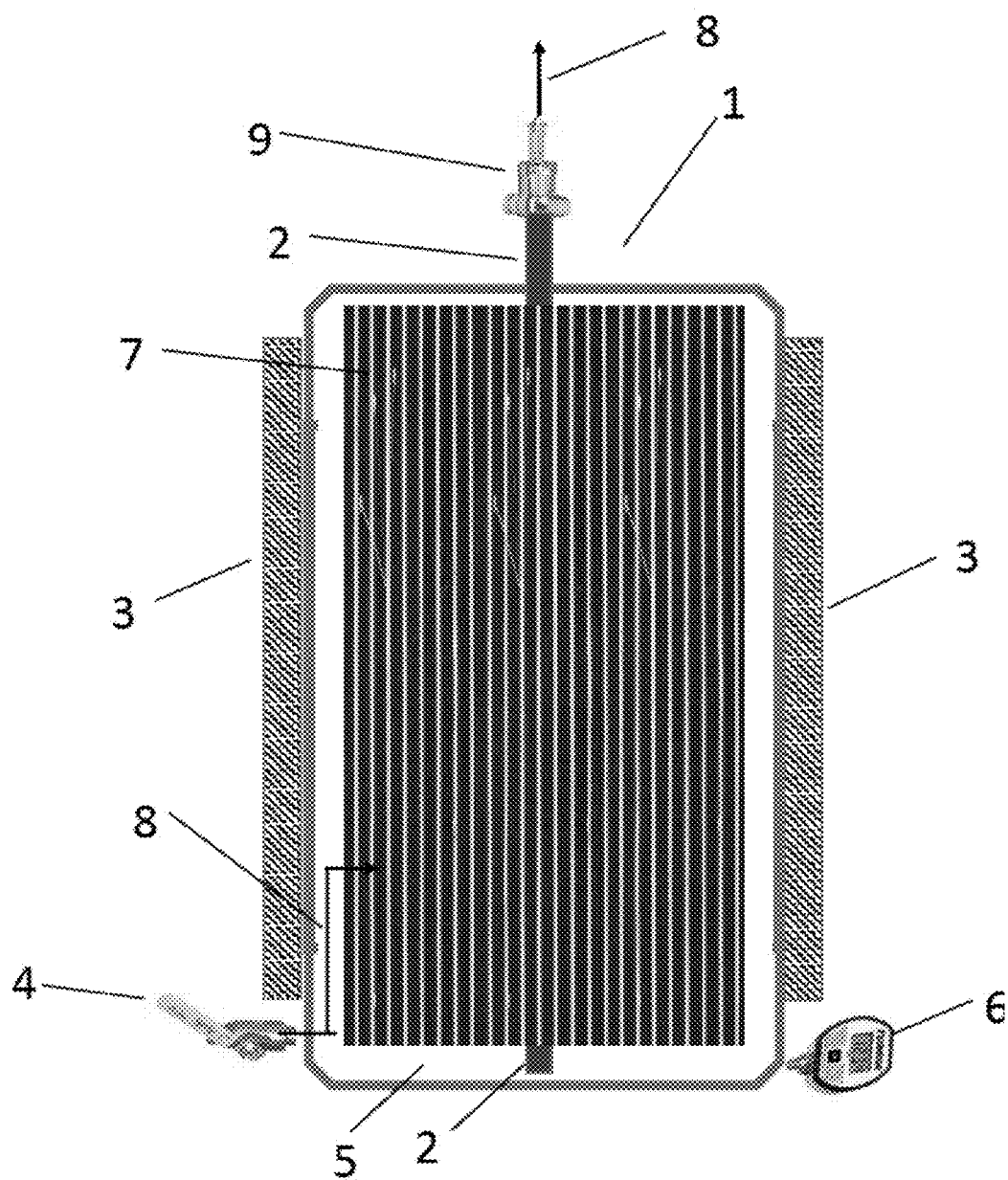

HYPERBARIC PROCESS FOR APPLYING AND CURING AN ORGANIC POLYMERIZABLE TREATMENT

The present invention relates to a process for applying and curing a polymerizable coating onto a substrate.

Polymeric coatings are used on porous and nonporous substrates to provide a variety of additional attributes to these materials.

Hydrophilic coatings are applied to substrates to increase the propensity of a material or fabric to absorb water or to help spread absorbed water across a larger area to increase the evaporation rate of the absorbed water. Athletic apparel, for example, may have a hydrophilic coating applied to it to help absorb perspiration and to help wick that perspiration over a large area of the apparel to speed evaporation and evaporative cooling.

Conversely, hydrophobic coatings are applied to various substrates to protect them from moisture. In textile applications, for example, hydrophobic coatings are used provide a water-repellant finish to apparel such as rain gear and outerwear such as coats, hats and shoes. These coatings are applied in a wide variety of industrial, vehicular and construction applications in which it is important to prevent water from wetting or seeping through the substrate. Some examples of technical textiles that benefit from hydrophobic coatings would be house "wrap" and roofing materials. Electronics packaging is another area that benefits from hydrophobic coatings.

Oleophobic coatings are applied to textiles or other materials to prevent oil-based liquids from staining or penetrating the substrate. Oleophobic coatings are often oleophobic, lipophobic and hydrophobic.

Highly effective coating materials have been developed. However, application methods are often inadequate, especially when very low coating weights are desired, which is often the case. In textile applications, for example, heavy coatings add undesirable weight and can impart a heavy and stiff feel to a fabric. This has an adverse affect on tactile and physical properties commonly known in the industry as "breathability", "drape" and "hand". Weight is also an important factor in electronics packaging and other industrial applications. Thin coatings potentially have a cost advantage as well, as less coating material is needed.

Methods for applying very thin polymer coatings suffer from high cost, inadequate coating performance, or both. The inadequate coating performance is generally due to defects in the coating when applied at low coating weights.

Textiles, for example, are usually porous materials often made up of intersecting fibers. Ideally, one wants to apply an effective coating without blocking most of the pores, as doing so diminishes breathability, drape and hand. Conventionally, the most common way of applying hydrophobic coatings to textiles is using a "pad and cure" method that involves pulling a length of woven or knitted fabric through an aqueous or solvent-based chemical bath, squeezing or vacuuming out the excess liquid and then drying and curing the wet fabric. This process entails a great many difficulties, including textile shrinkage, inconsistent application of the active ingredients, time-varying changes in the concentration of bath ingredients, the use of large amounts of energy to remove the water or solvent, and large amounts of chemical waste which needs to be recycled or disposed of. In addition, many potential finishing chemicals cannot be coated onto a textile in this manner, because they are not compatible with water or else react prematurely with themselves or other ingredients in the bath, or because they will quickly precipitate out of the bath. Solvent-based systems have the problems of worker exposure and environmental concerns, as well as added costs for recovery and reuse of the solvents. US Patent Publication 2008/0107822 describes a method of coating a textile with a nano-scale layer of vapor-condensed monomers plus additional chemicals, followed by a plasma-based curing method to polymerize the coated monomer. The plasma-based curing requires expensive equipment, operates slowly and, being a line-of-sight method, does not produce a uniform cure.

Nonporous substrates such as electronic devices may have small cracks or interstices between their component parts that are difficult to seal without applying a heavy coating. These devices are generally sealed by enclosing them in a gasket case, or by spraying them with a hydrophobic treatment, or by plasma-based chemical vapor deposition processes. Sealed gasket cases contain entrapped gas. When at subatmospheric pressures, as are often encountered, for example, in airplanes or high altitudes, the trapped gas expands and can crack the case. Sprayed hydrophobic treatments have trouble sealing small cracks and openings. Plasma-enhanced chemical vapor deposition is expensive, slow and is a line-of-sight method that does not easily cover all surfaces of the device.

This invention is a method for applying an organic polymer coating a substrate. The method comprises the steps of:

1) under non-polymerizing conditions, applying a curable coating composition that at 22° C. is a liquid or a suspension of one or more solids in a liquid phase to at least one surface of the substrate, wherein the curable coating composition contains i) at least one polymerizable monomer that polymerizes in the presence of free radicals, has exactly one free-radical-polymerizable group per molecule and has a boiling temperature of at least 100° C. at one atmosphere pressure, and 2) at least one heat-activated polymerization initiator, which curable composition contains no more than 10% by weight of organic compounds that have boiling temperatures below 100° C. at one atmosphere pressure and no more than 5% by weight water, based on the entire weight of the coating composition; then 2) under non-polymerizing conditions, purging molecular oxygen from the interior of a vessel containing the substrate with the applied curable coating, 3) during and/or after step 2), pressurizing the purged vessel containing the substrate with the applied curable coating with an oxygen-deficient gas to a gas pressure of at least 120 kPa actual, and then, without exposing the substrate with applied curable coating to an atmosphere containing 1 mole-percent or more oxygen, 4) at least partially curing the curable coating composition by heating the substrate with the applied curable coating composition under oxygen-deficient conditions to a temperature sufficient to activate the heat-activated polymerization initiator and initiate polymerization of the at least one polymerizable monomer, to form an at least partially cured organic polymer coating on the substrate.

The invention is also a reaction vessel for curing a substrate coated with curable coating composition, comprising:

exterior walls that define an interior space of the reaction vessel for holding the coated substrate;

at least one sealable opening for inserting and removing the coated substrate;

means for sealing the sealable opening;

at least one gas port for introducing and removing a gas into the interior space;

at least one spindle disposed within the interior space, said spindle having a longitudinal bore and multiple openings that create fluid paths from the longitudinal bore into the interior space of the reaction vessel, the longitudinal bore also being in fluid communication with the at least one gas port;

means for transporting a gas into at least one of said at least one gas port, through the spindle, through the openings in the spindle and through the interior space and in contact with a coated substrate disposed in the interior space and out of at least one of said at least one gas port, means for pressurizing the interior space of the reaction vessel and heating means for heating the interior space of the reaction vessel.

BRIEF DESCRIPTION OF THE DRAWINGS

FIG. 1 is a front view of an apparatus for use in the process of the invention.

FIG. 2 is a front sectional view of an apparatus for use in the invention.

FIG. 3 is a front section view of an apparatus for use in the invention, with a wound textile disposed in a reactor vessel and wrapped around the central spindle 10 of FIG. 2 by rolling the textile around the spindle.

In step 1) of the process of the invention, a curable coating composition as described herein is applied to the substrate. Because the curable composition is a liquid or suspension, it can be applied to the substrate by any of many convenient methods, such as by rolling, brushing, spraying, immersing the substrate into the composition, applying a puddle and scraping the composition onto or into the substrate using, for example, an air knife or doctor blade, and other methods. Immersion methods can be used when the curable coating composition contains a large amount of a liquid carrier. Immersion methods are generally followed by means for removing excess coating composition before curing.

Conditions during step 1) are non-polymerizing conditions. Non-polymerizing conditions are conditions such that little (no more than 10 mole-%, preferably no more than 5 mole-%) or no curing of the monomer(s) occurs during this step. In particular, the temperature during step 1) is selected such that the heat-activated polymerization initiator is not activated. The temperature during step 1) preferably is below the one hour half-life temperature of the heat-activated polymerization initiator. In addition, it is preferred that no other source of free radicals is present during the coating step. For purposes of this invention, conditions including a temperature below the one hour half-life temperature of the heat-activated polymerization initiator and including no other source of free radicals are considered as non-polymerizing conditions.

Pressure and temperature conditions during step 1) also are selected such that the monomer(s) and heat-activated polymerization initiator do not appreciably volatilize. Step 1) may be, for example, performed under an atmospheric pressure of approximately 1 bar, i.e. about 50 to 150 kPa or about 90 to 119 kPa.

A preferred coating weight is 1 to 150 grams per square meter of area of the substrate to be coated ($g/m^2$), especially 1.5 $g/m^2$ to 70 $g/m^2$ or 1.5 to 20 $g/m^2$. In specific embodiments, the coating weight may be, for example, 1.5 to 10 or 1.5 to 5 $g/m^2$ or 6 to 15 $g/m^2$, whereas for heavier substrates (especially porous substrates), the coating weight may be higher. Higher coating weights can be applied by immersion padding or by using two or more chemical transfer apparatuses in series or by passing the substrate through a chemical transfer apparatus multiple times. A significant advantage of this invention is that very low coating weights are easily applied and there is minimal chemical "waste" or loss to evaporation.

Molecular oxygen is then purged from a vessel that contains the coated substrate. By "purging", it is meant simply that molecular oxygen is removed from the atmosphere within the vessel. Preferably, the purging step also removes molecular oxygen which is in contact with the surface of the substrate, as well as molecular oxygen that resides any pores or interstitial spaces in the substrate that are in fluid communication to a substrate surface and thus may come into contact with the applied curable coating during the process. For example, prior to purging, molecular oxygen may occupy all or a portion of those pores or interstitial spaces. In such cases, the molecular oxygen typically is present as a component of trapped air. Textiles, for example, are usually highly porous materials that have interstitial spaces between intersecting fibers that make up the material. Some molecular oxygen may be chemisorbed or physisorbed onto one or more surfaces of the substrate. During the purging step, chemisorbed or physisorbed molecular oxygen preferably is removed, and molecular oxygen preferably is removed from such interstitial spaces. Electronic devices may have through-holes, or small cracks or openings at the junction of its constituent components, from which molecular oxygen is preferably removed during the purging step 2).

The purging step 2) is performed under non-polymerizing conditions as described with regard to step 1). In addition, pressure and temperature conditions during the purging step 2) are selected such that the monomer(s) and heat-activated polymerization initiator do not volatilize.

The purging step can be performed in various ways.

One way of performing the purging step is to place the substrate with applied curable coating in a container, and replace the atmosphere in the container with an oxygen-deficient gas. If the substrate is porous (as is the case with most textiles), the oxygen-deficient gas can be flowed through the substrate to mechanically force trapped air or molecular oxygen from the pores. Thus, for example, the substrate with applied curable coating may be disposed in a container and a flow of oxygen-deficient gas introduced into the container, with simultaneous removal of gases, such that the flow path of the oxygen-deficient gas is through the substrate and/or past the surface of the substrate. This flow of gas through and/or past the substrate mechanically displaces trapped air or molecular oxygen. For coating of electronics, gas pressure is used to help displace trapped air in tiny openings and in small cracks and voids between a circuit element and a printed circuit board, for example. A pressure drop of about 0.1 to 2 MPa across the vessel and/or through the substrate is often sufficient to dislodge molecular oxygen in this manner. If desired, the molecular oxygen content of the removed gases can be monitored, and in such a case the flow of oxygen-deficient gas may be continued until the molecular oxygen content of the withdrawn gas falls to less than 1 mole-percent, less than 0.1 mole-percent, or some lower value if desired.

An oxygen-deficient gas for purposes of this invention is a gas containing at most 1 mole-percent molecular oxygen ($O_2$), preferably no more than 0.1 mole percent molecular oxygen. The oxygen-deficient gas may contain at least 98 mole-percent, preferably at least 99 mole percent and more preferably at least 99.9 mole percent, of an inert gas such as nitrogen, argon, carbon dioxide, steam, helium or a mixture of any two or more thereof. In some embodiments, the oxygen-deficient gas may contain one or more gas-phase, polymerizable monomers that have a boiling temperature of 40° C. or less at one atmosphere pressure and one or more polymerizable carbon-carbon double bonds. Examples of such gas-phase monomers include ethylene, propylene, tetrafluoroethylene, hexafluoropropene_and the like. One preferred oxygen-deficient gas includes at least 98 mole-percent nitrogen and up to 0.1 mole-percent molecular oxygen, with the remainder being trace gases that are gases at room temperature and 1 atmosphere pressure. Another preferred oxygen-deficient gas includes at least 50 mole-percent nitrogen, up to 1 mole-percent or up to 0.1 mole-percent molecular oxygen, up to 49.9 mole-percent of a gas-phase monomer, with the remainder if any being trace gases that are gases at room temperature and 1 atmosphere pressure. Another oxygen-deficient gas includes at least 98 mole-percent steam and up to 0.1 mole-percent molecular oxygen, with the remainder being trace gases that are gases at room temperature and 1 atmosphere pressure. Still another preferred oxygen-deficient gas includes at least 50 mole-percent steam, up to 1 mole-percent or up to 0.1 mole-percent molecular oxygen, up to 49.9 mole-percent of a gas-phase monomer, with the remainder if any being trace gases that are gasses at room temperature and 1 atmosphere pressure.

The purging step can be performed by mechanically compressing the substrate with applied curable coating to remove molecular oxygen from pores or other interstitial places, if mechanical compression can be done without damaging the substrate. Such compression can be performed on a textile, for example, by compressing the coated textile between rollers, one or both of which can be heated, by tensioning the coated textile against a drum or other surface (which again can be heated), by physically compressing and releasing a folded pile of fabric, or otherwise. Mechanical compression can be performed under an oxygen-deficient gas so that molecular oxygen does not re-enter the void spaces when the compressive force is removed.

Another way of purging molecular oxygen is to place the substrate under reduced atmospheric pressure, provided the monomer(s) and free-radical initiator do not volatilize to a concentration of less than 30% of their initial concentration in the curable coating composition.

Combinations of the above approaches for removing air can be used.

During and/or after step 2), a reaction vessel containing the purged substrate with the applied curable coating is pressurized with an oxygen-deficient gas to a gas pressure of at least 120 kPa actual. As with steps 1) and 2), this pressurizing step 3) is performed under non-polymerizing conditions.

In the pressurizing step 3), the gas pressure may be, for example, at least 500 kPa or at least 750 kPa. There is in principal no upper limit on the gas pressure, other than the limitations of the reaction vessel and associated equipment. A practical upper limit on gas pressure is about 15 MPa. In some embodiments, the gas pressure is up to about 12 MPa, up to 11 MPa, up to 10 MPa, up to 5 MPa, 3.5 MPa, up to 2.5 MPa or up to 1.5 MPa. All gas pressures are actual unless otherwise indicated.

The pressure applied in pressurizing step 3) has been found to influence the properties of the treated substrate. When the substrate is a fabric, increasing the pressure during pressurizing step 3) tends to produce treated fabrics having higher air permeability than when lower pressures are used. Therefore, selection of the pressure applied during pressurization step 3) can be used as an operating parameter to vary the air permeability of the treated fabric. Although the invention is not limited to any theory, it is believed that higher pressures tend to produce thinner coatings, which increases the space between the yarns, thereby increasing air permeability.

It is believed the pressurizing step helps to push the coating into the interior of the porous substrates such as textiles and also helps to spread the coating against individual fibers and/or filaments that compose the substrate. This is believed to allow the coating composition to penetrate between the individual fibers and/or filaments, even in cases such as fabrics woven from a spun fiber such as spun staple fiber, which is very difficult to achieve without the pressurization step.

For electronic substrates, the pressuring step is believed to push the coating into tiny spaces between circuit components and circuit components and a printed circuit board (for example) and into tiny openings, such as contacts and metal vias.

In some embodiments, the pressurization step 3) can be performed as part of purging step 2). For example, the purging step 2) can be performed by conducting one or more pressurization/depressurization cycles, in which in each cycle the vessel containing the coated substrate is pressurized to superatmospheric pressure (as described above with regard to pressurization step 3) with an oxygen-deficient gas and then depressurized to a pressure of, for example, 50 to 150 kPa actual. Up to 20, up to 10 or up to 3 such pressurization/depressurization cycles may be performed. The pressurization portion(s) of this cycling corresponds to pressurization step 3); in such case no subsequent pressurization step is needed and therefore can be eliminated is desired, although a final pressurization step may be performed if desired.

Performing pressurization/depressurization cycles as just described is particularly beneficial when the substrate has a low air permeability prior to being coated, such as 3 standard cubic feet/minute/square foot (0.01524 m/second) or lower as measured according to ASTM D797, using a Textest FX 3300 instrument and a 38 cm² test area.

The curable coating composition is then at least partially cured by heating the substrate with the applied curable coating composition under oxygen-deficient conditions. "Oxygen-deficient conditions" for purposes of this invention means that the polymerization is performed in an oxygen-deficient atmosphere, as described before, or while the substrate is immersed in a liquid or supercritical fluid. A preferred liquid has a boiling temperature (at 1 atmosphere pressure) of 80 to 220° C., preferably 80 to 145° C. A supercritical fluid is defined as a fluid at a temperature and pressure above its critical point, where distinct liquid and gas phases do not exist. After being pressurized with an oxygen-deficient gas in step 3), the coated substrate is not exposed to an atmosphere containing 1 mole-percent or more oxygen until after step 4) is performed.

In some embodiments, polymerization step 4) is performed while the coated substrate from step 3) is under an oxygen-deficient gas. In such embodiments, polymerization step 4) may be performed in the same vessel in which pressurization step 3) is performed. In such a case, step 4) may be performed under superatmospheric pressure as described with regard to pressurization step 3).

The coated substrate in some embodiments is maintained continuously at such superatmospheric conditions from the start of step 3) until polymerization step 4) has been performed. Curing of the polymer under superatmospheric is believed to fix the polymer in place, such that when the pressurized condition is released, the polymer remains in place to provide the desired coating property.

In other embodiments, polymerization step 4) is performed with the coated substrate from step 3) immersed in a liquid or supercritical fluid such as supercritical carbon dioxide.

In this curing step 4), the substrate and applied curable coating composition are heated to a temperature sufficient to activate the heat-activated polymerization initiator and initiate polymerization.

As curing step 4) is performed, the vessel may be sealed to prevent escape of gas from the interior of the vessel. Even if sealed, the vessel may contain means such as a relief valve for venting gases from the interior of the reactor if the reactor pressure exceeds a predetermined value, and/or for regulating pressure to a predetermined value. It is also within the scope of the invention to maintain a gas flow through the vessel during step 4), provided the requisite pressure is maintained and the atmosphere (if any) in the vessel remains oxygen-deficient.

In the case of immersion in a supercritical fluid, the pressure may be reduced after or during the polymerization step such that the supercritical fluid converts to the gas phase. The remainder of the polymerization, if any, may be performed under such gas phase, at atmospheric pressure or a superatmospheric pressure.

Preferred curing temperatures in step 4) are in general from 80 to 210° C. The curing temperature may be at least 90° C., at least 100° C. or at least 120° C. and may be up to 190° C., up to 175° C., up to 160° C. or up to 150° C. Lower curing temperatures within the aforementioned ranges may be beneficial for treating fabrics that are more heat-sensitive, such as polyester, nylon and polypropylene fabrics. Less fabric shrinkage is often seen at lower curing temperatures, particularly 150° C. or lower. For example, fabric shrinkages of 0.5% or less are often seen at those lower curing temperatures. Temperatures up to 140° C. are especially suitable for processing acrylic and aramid fabrics, and temperatures up to 150° C. are especially suitable for processing cotton.

Curing under oxygen-deficient conditions is continued until at least 50 mole-percent, preferably at least 75 mole-percent of the polymerizable monomer(s) in the curable coating composition is converted to polymer. In some embodiments, curing is performed under the pressurized oxygen-deficient gas until at least 75 mole-percent, at least 85%, at least 95 mole-percent or at least 98 mole-percent of the polymerizable monomer(s) in the curable coating composition is converted to polymer. Conversion during this step may reach 100%.

In some embodiments, step 4) is performed under a oxygen-deficient gas at superatmospheric pressure as describe with regard to step 3), until the conversion of the polymerizable monomers in the curable coating composition is 50 to 99 mole-percent, preferably 75 to 95 mole-percent and more preferably 85 to 95 mole-percent, and further curing is performed at a gas pressure below 120 kPa actual, such as 75 to 119 kPa or 95 to 105 kPa. In other embodiments, step 4) is performed under oxygen-deficient conditions until the conversion of the polymerizable monomers in the curable coating composition is 50 to 99 mole-percent, preferably 75 to 99 mole-percent, and further curing is performed under air. In this work, "curing" and "polymerization" are used interchangeably.

The time required to perform step 4) is typically short, such as from 0.5 to 60 minutes or from 5 to 20 minutes, although longer or shorter times can be used in particular circumstances. The time required for step 4) will of course depend somewhat on factors such as the cure temperature, the particular monomers and the particular polymerization initiator.

It is generally useful to perform at least steps 2), 3) and 4) within a single reaction vessel. Thus, the substrate with applied curable coating composition is disposed within the reaction vessel and purged of molecular oxygen with the reaction vessel. The reaction vessel is then pressurized with the oxygen-deficient gas and heated to the polymerization temperature to effect the cure of the curable coating composition.

Although it is possible to perform the coating step 1) in the same reaction vessel, it is generally preferred to perform the coating step in separate equipment adapted for applying a thin coating. It is not necessary to perform steps 2), 3) and 4) immediately after the coating step 1).

A suitable reaction vessel is an autoclave or other vessel that is capable of handling the pressures encountered in steps 3) and 4). Such a reaction vessel preferably includes various gas handling equipment to effect the introduction and removal of gases from the interior space of the vessel, for pressurizing the vessel and for applying heat. Such means are well-known and no special design of such means is necessary.

FIGS. 1-3 depict a suitable apparatus for performing steps 2), 3) and 4) of the invention.

In FIGS. 1-3, reaction vessel 1 includes bottom section 13B and top section 13A, which together define interior space 5 in which substrate 7 (FIG. 3) is disposed for performing steps 2), 3) and 4) of the invention. Reaction vessel 1 is, for example, an autoclave or other container adapted to withstand the temperatures and pressures encountered in the process. When closed and in operation, bottom section 13B and top section 13A (FIG. 1) are sealed along junction 11 (FIG. 1) using any suitable sealing method such as, for example, nuts-and-bolts 12 (FIG. 1), other mechanical sealing devices such as clips, clamps or rivets, magnetic sealing devices, adhesives, gasketing, and the like. In the embodiment shown in FIG. 1, the substrate (not shown) is mounted on central spindle 2, supported by lower support 2A and held in place with plate 2B. Central spindle 2 has a longitudinal bore and has exterior openings 10 (FIG. 2) that create fluid paths from the longitudinal bore into interior space 5 of reaction vessel 1.

Reaction vessel 1 further includes means for introducing gas into and removing gas from interior space 5. In the preferred embodiment shown, reaction vessel 1 is equipped with first gas port 4 and optional second gas port 9. As shown, second gas port 9 is in fluid communication with the central bore of central spindle 2. Alternatively, a single gas port can serve as both an inlet and an exit port.

During purging step 2), an oxygen-deficient gas is introduced into interior space 5, passes through openings 10 in central spindle 2, and is removed via one of gas ports 4 and 9. Gas can flow between gas port 4 and gas port 9 in either direction. Gas port 4 may be an inlet port, through which the oxygen-deficient gas enters interior space 5 and from there flows past substrate 7, into openings 10, through the central bore of spindle 2 and out through gas port 9. Alternatively, the direction of gas flow can be reversed, flowing through gas port 9 into the central bore of central spindle 2, passing through openings 10 into interior space 5 and through substrate 7 before and being withdrawn from interior space 5 via gas port 4.

The embodiment shown in FIGS. 1-3 is a preferred design, particularly well-adapted for treating rolled goods such as a rolled textile. As shown in FIG. 3, a flexible substrate 7 such as a rolled textile is wound around central spindle 2, or rolled onto a core that is then mounted onto central spindle 2. Oxygen-deficient gas therefore travels through flexible substrate 7 as it passes from gas port 4 into openings 10 of central spindle 2 and from there out of reaction vessel 1 via gas port 9 (or in the opposite direction from gas port 9 to gas port 4). This movement of gas through the substrate is an effective way of removing molecular oxygen trapped within pores or other interstices of substrate 7.

The pressurization step 3) and curing step 4) also are performed in reaction vessel 1, in the embodiment shown in FIGS. 1-3.

During operation, the substrate with applied curable coating is inserted into interior space 5 of reaction vessel 1 (if coating step 1) is not performed therein). A flow of oxygen-deficient gas is established into, through and then out of interior space 5 to purge molecular oxygen. This flow of gas may be continued, for example, until the molecular oxygen content of the withdrawn gas falls below 1 mole-percent, below 0.1 mole-percent or other predetermined value. Alternatively, the flow of gas may be continued until a volume of gas equal to a predetermined multiple of the volume of interior space 5 (such as from 2 to 50 reaction volumes or 2 to 10 reactor volumes) has been passed through reaction vessel 1.

During and/or after the purging step, additional oxygen-deficient gas is introduced into reaction vessel 1 containing substrate 7, to pressurize interior space 5 to gas pressures as described before. Following pressurization of the reaction vessel, heating is applied via heating means 3 to increase the temperature in interior space 5 to initiate polymerization. The polymerization is done under oxygen-deficient conditions, preferably under an oxygen-deficient gas while maintaining the pressure as described before. Heating is maintained until at least 50 mole-percent of the polymerizable monomers have been converted to polymer. As shown, heating means 3 are provided to heat the contents of reaction vessel 1 for performing step 4) of the process. The heating means can be, for example, a heating jacket, electrical heaters, radiant heaters, placing reaction vessel 1 into an oven or oil bath that is heated using natural gas or electricity, or other suitable heating means. It is also possible to perform the necessary heating by heating the oxygen-deficient gas fed into reaction vessel 1.

In an alternative embodiment, a textile substrate coated with the curable coating composition is plaited, and steps 2), 3) and 4) are performed on the plaited textile. In such an embodiment, the plaited, coated textile may be contained within a bin that has one or more gas ports through which gas can be introduced or removed to perform the purging, pressurization and curing steps. The plaited, coated textile may be plaited to form a series of horizontal layers with in the bin. In such a case, the gas ports may be arranged at or near the bottom and top of the bin, so during the purging step 2) a flow of gas may be established upwardly or downwardly through the layers of the plaited, coated textile. As used herein, "plaited, coated textile" may also be understood to include layers of fully-finished apparel or other garments.

In the alternative embodiment just described, the bin may be modular to allow loading, plaiting and unloading to be performed outside of a larger pressure vessel in which the purging, pressurization and curing steps are performed. After loading, one or more of such bins are introduced into the pressure vessel, and the purging, pressurization and polymerization steps 2), 3) and 4) are performed while the loaded bin resides within the pressure vessel. The pressure vessel contains one or more inlet ports for introducing and removing gas into and from the interior of the pressure vessel and the bin(s), and heating means to bring the contents of the bin(s) to the needed polymerization temperature.

The invention in a specific embodiment is a reaction apparatus for curing a substrate coated with curable coating composition, comprising A. an exterior pressure chamber defining an interior space, the exterior pressure chamber being capable of withstanding an internal pressure of 0.5 to 15 MPa actual;

B. a bin defining an interior volume for holding a layered substrate within the bin such that the layers of the substrate are arranged horizontally in the bin, such bin being adapted to fit within the interior space of the pressure chamber;

C. a gas plenum positioned at the bottom of the interior volume of the bin, the gas plenum having multiple openings that during operation admit gas into the interior volume bin;

D. at least one opening positioned at or near the top of the bin for removing gas from the interior volume of the bin; and E. heating means for heating the interior volume of the bin;

F. gas circulation means for establishing a flow of gas to and through the gas plenum while the bin is the interior space of the exterior pressure chamber, through a layered fabric in the bin and out of the bin through said at least one opening positioned at or near the top of the bin; and G. Means for establishing a superatmospheric pressure within the interior space of the exterior pressure chamber.

Using such an apparatus, the layered substrate is coated with the curable coating composition and introduced into the bin in layered fashion such that multiple, horizontally-arranged layers of the coated substrate are present in the bin. The bin is then introduced into the interior of the exterior pressure chamber where purging step 2), pressurization step 3) and polymerization step 4 are performed. During at least purging step 2), a purging gas is introduced into the bin through the openings in the gas plenum, flows upwardly through the layers of the substrate, and is withdrawn at or near the top of the bin. The withdrawn gas may flow into the interior space of the exterior pressure chamber. Pressurization step 3) is performed with the bin in the exterior pressure chamber either by a) introducing gas into the bin through the openings of the gas plenum (while either preventing the gas from escaping from the bin or by allowing the gas to escape from the bin into the exterior pressure chamber) or by pressurizing the interior space of the exterior pressure chamber while allowing the pressurizing gas to enter the bin from the interior space of the exterior pressure chamber through one or more fluid conducts connecting the interior space with the interior of the bin.

The heating means F. may be any heating means such as is described above. The gas circulation means G. includes a conduit for supplying gas from a gas source to the gas plenum, and a means for establishing a pressure differential that provides a motive force for moving gas through the openings of the gas plenum, through the layers of substrate in the bin, and out of the openings at or near the top of the bin. The means for establishing a pressure differential may include, for example, a pressurized source of the gas; a fan or blower or pump; a vacuum pump, and the like.

The sequential steps of coating, purging and pressurizing prior to curing has been found to lead to a significant and unexpected improvement in the effectiveness of the cured coating, particularly when applied to textiles and electronic devices. In particular, coatings applied and cured in this manner often exhibit significantly better water-repellency than when the pressurization step 3) is omitted. Although the invention is not limited to any theory, it is believed the increased pressure applied in step 3) mechanically forces the curable coating composition into pores, interstices, cracks or other small openings in the surface of the substrate, thereby facilitating the penetration of the coating composition into such small openings and sealing them. The curable composition then cures in place to produce a permanent seal when the gas pressure is released.

In cases in which the curable coating composition contains small particles, some or all of the small particles may be forced into such openings to form a mechanical seal or for anchoring of said particles, thereby providing both laundry durability and abrasion resistance against use-related loss of the particles.

Increased pressure during step 4) tends to limit volatilization of the various components of the curable coating composition during the curing step 4), in particular certain carrier compounds and/or volatile monomers as described below. In particular, the process has been found to be quite beneficial when the curable coating composition contains one or more compounds that has a vapor pressure of 1 to 67 kPa (about 10 to 500 torr), especially 6.7 to 53 kPa (about 50 to 400 torr) at the temperature of the polymerization step 4). Such a compound may be, for example, one or more of the monomers and/or one or more of the carrier materials as described below. Examples of components of the curable coating composition that have vapor pressures within the foregoing ranges at a polymerization temperature of 110 to 125° C. include, for example, trimethoxy(1H,1H,2H,2H-heptadecafluorodecyl)silane, perfluorohexyl ethyl acrylate, perfluorohexyl ethylene and perfluorooctyl ethylene. The curable coating composition may contain, for example, at least 1 weight-percent, at least 5 weight-percent, at least 10 weight-percent, at least 25 weight-percent or at least 45 weight-percent of compounds having vapor pressures as described in this paragraph.

The substrate coated in this process is not particularly limited, and any solid material onto which a coating can be produced in accordance with the invention can be used in the substrate. Particular benefits are seen in cases in which the substrate is porous and/or has small cracks or interstitial spaces that are to be sealed by the applied coating.

Useful porous substrates include fibrous textiles. By "fibrous", it is meant that a surface of the textile is made up of or includes fibers of at least one type. The fibers define interstitial void spaces in which air and/or molecular oxygen is entrapped and into which the applied curable coating composition can penetrate when applied and during the pressurization step 3). Such a porous fabric characterized may have, prior to coating in accordance with the invention, an air permeability of at least 0.2 cubic foot/minute/square foot (0.001016 m/s) as measured according to ASTM D737, using a Textest FX 3300 instrument and a 38 cm$^2$ test area. More preferably, the porous fabric has an air permeability of at least 10 (0.0508), at least 50 (0.204), at least 75 (0.3060) or at least 130 (0.6604) feet/minute/square foot (m/s). The air permeability of the porous fabric may be any higher value, such as up to 200 cubic feet/minute/square foot (1.016 m/s). Some fabrics, such as PTFE or polyurethane based membrane fabrics, may be more permeable to moisture vapor, more than they are to air. Such fabrics may have a moisture transmission rate of at least 1000 g/sq meter/24 hours, preferably 5000 to 20,000 g/sq m/24 hour, as measured according to JISL 1099B1.

The fibers of the porous substrate may be, for example, woven, knitted, entangled, knotted, felted, glued or otherwise formed into a fabric, non-woven or textile having sufficient mechanical integrity to be carried through the process of the invention. Such a fabric includes fibers that may be, for example, a natural fiber such as cotton, hemp, wool, linen, silk, tencel, rayon, leather, bamboo, cellulose and the like, or a synthetic fiber such as nylon, para- or meta-aramid, polypropylene, polyester (including PET), polyacetate, polyacrylic, polylactic acid, cellulose ester or other fiber and blends of any two or more of the above. It may a smooth or fleeced fabric and it may contain a minor (up to 50%, preferably up to 10% or up to 3% by weight) of a stretchable fiber, such as Elastane, Lycra, or Spandex.

As described before, the invention is particularly suitable for treating textile rollstocks. When the substrate is in the form of a sheet, it should have a thickness of no greater than about 12 mm, and preferably has a thickness of no greater than 10 mm or no greater than 8 mm. The substrate can have any smaller thickness provided it has enough mechanical integrity to be conducted through the process. The curable composition in some embodiments is applied onto textile roll goods that may have widths of 100 mm or more, such as 1600 mm up to 7 meters or more.

The process is not limited to rollstock fabrics. Folded or unfolded textile sheets can be used as the substrate, as can finished articles that have a textile component. The invention is useful for applying coatings to articles of clothing such as shirts, pants, sweaters, coats, sweatshirts, gloves, hats, scarfs, leg- and arm-warmers and stockings, as well as shoes and other footwear, curtains, bedding, and to other textile materials such as filler and insulation material including natural down and synthetic insulation material such as Fiberfill and other blown polyester or nylon filler. The process of the invention can be used to re-treat articles of clothing that have had a previously-applied coating worn- or washed off or otherwise removed, and which require reapplication of the coating to restore needed functional attributes.

In other embodiments, including, but not limited to shoes, the substrate may be coated on one side as is the case, for example, with leather, or synthetic leather products, such as vinyl, or for athletic shoes, polyester, polypropylene or nylon, including mixtures of synthetic and natural fibers, which have an exposed fibrous or webbed surface on the side that is coated. The coating, and therefore the cured polymer, may be applied on top of applied features such as sewn seams, logos, labels, decorative features, Velcro fasteners, buttons, snaps, rivets and zippers. The substrate may be a nonwoven, or a cellulosic material such as paper, tissue paper or cardboard and the like.

In other embodiments, the substrate is an electronic component. The type of electronic component is not critical. The electronic component may be, for example, a discretely packaged basic electronic component, or an array or network of electronic components such as a semiconductor integrated circuit, a hybrid integrated circuit or a thick film device. It can be a complete unit, such as for example, a mobile telephone, MP3 player, fitness electronics, "smart" textiles (i.e., wearable electronics) and military electronics. Each individual basic electronic component may be, for example, a semiconductor device such as a transistor, vacuum tube or diode, a passive component such as a resistor, inductor, transformer or capacitor, an optoelectronic device, and optical detector or emitter, an electrical power source, a magnetic induction device, memory, and RC or LC network, an antenna, a piezoelectric device, a crystal, a resonator, a terminal or connector, an antenna, a cable, a switch, a protection device such as a fuse, circuit breaker, varistor or inrush current limiter, or an electromechanical component, among other.

An optional oxidative pretreatment step may be performed before the coating step 1). Such an oxidative pretreatment step may include heating the substrate to an elevated temperature such as 100 to 220° C., preferably 150 to 190° C., under an oxygen-containing atmosphere at superatmospheric pressure. The temperature should be below the temperature at which the substrate degrades or permanently deforms. The oxygen-containing atmosphere may contain at least 20 mole-percent, at least 50 mole-percent or at least 75 mole-percent molecular oxygen, and may contain up to 100 mole-percent, up to 99 mole-percent or up to 95 mole-percent molecular oxygen. The superatmospheric pressure may be, for example 125 kPa to 15 MPa, preferably 300 kPa to 5 MPa. The substrate may be held under the conditions of the oxidative pretreatment step for a period of, for example, 1 minute to 1 hour.

The oxidative pretreatment step has been found to improve the performance of the subsequently applied coating. In particularly, better water-repellency and/or better oleophobic properties are obtained when the oxidative pretreatment step is performed. Although the invention is not limited to any theory, it is believed that surface coatings such as sizing agents and/or lubricants that are often applied during fabric manufacturing, are oxidatively removed during the oxidative pretreatment step, permitting better contact between the substrate surface and curable coating composition.

The oxidative pretreatment provides for significant advantages over alternative methods. Removal of a lubricant from a fabric (de-sizing) can be done using a water-based cleaning step. However, exposure of some fabrics, such as aramids, to water is known to weaken the fiber strength, and in addition the water-cleaning step requires a drying step and often promotes fabric shrinkage. Oxygen-containing atmospheric-pressure plasmas, containing for example, a 90% argon+10% oxygen gas mixture, may also be used for this de-sizing step, however, it is noted that plasma-based cleaning is a more expensive approach than the aforementioned high pressure oxygen cleaning method, and exposure of the fabric to atomic oxygen may weaken the fiber. The high pressure oxidative pretreatment step avoids these problems that may occur with plasma-based cleaning. Both methods may be used to provide water-free cleaning or de-sizing of textiles and nonwovens and/or for adhesion promotion and/or for improved laundry durability of the treatment.

The curable coating composition contains a) one or more free-radical-curable monomers that have exactly one free-radical-polymerizable group per molecule. The free-radical-curable monomer component a) has a boiling temperature of at least 100° C. The boiling temperature preferably is at least 120° C. and more preferably at least 150° C. All boiling temperatures mentioned herein are given at one atmosphere pressure unless otherwise indicated.

The free-radical-curable monomer preferably has at least one hydrocarbyl group that has at least six carbon atoms bonded directly or indirectly to the polymerizable group. The hydrocarbyl groups may be partially fluorinated, perfluorinated or non-fluorinated.

Preferably, at least one component a) monomer has a vapor pressure of no greater than 6.7 kPa, more preferably no greater than 1 kPa, at the polymerization temperature in step 4) of the process.

The component a) monomer or monomers may be liquid or solid at 22° C. If a mixture of monomers is used, they may all be liquids, may all be solids, or they may include a mixture of solid and liquid monomers. In preferred embodiments, component a) is a mixture of at least two monomers, at least one of which is solid at 22° C. and at least one of which is liquid at 22° C.

The free-radical polymerizable group can be any that polymerizes in a free-radical polymerization, but preferably is an alkenyl, acrylate, methacrylate or chlorosilane group. Acrylate and/or methacrylate groups are most preferred.

The hydrocarbyl group may be linear or branched aliphatic, alicyclic, aromatic or a group that contains of two or more thereof. The hydrocarbyl group may contain at least 10 or at least 12 carbon atoms. The hydrocarbyl group may contain, for example, 6 to 24 carbon atoms, 8 to 24 carbon atoms, 10 to 20 carbon atoms, or 12 to 18 carbon atoms. In some embodiments, the hydrocarbyl group is a linear alkyl or alkenyl group having 8 to 24, 10 to 20 or 12 to 18 carbon atoms. In some embodiments, the hydrocarbyl group is partially or perfluorinated, and contains 6 to 24, or preferably 8 to 20 carbon atoms.

The hydrocarbyl group may be bonded directly (i.e., through a covalent bond) to the free-radical polymerizable group, or indirectly thereto through a linking group.

Water preferably is soluble in the component a) monomer(s) to the extent of no greater than 2 parts by weight, more preferably no greater than 1 parts by weight and more preferably no greater than 0.25 part by weight, per 100 parts by weight of the monomer(s), at 30° C.

Examples of component a) monomers include, but are not limited to, one or more of the following: acrylic acid, methyl methacrylate, 2-ethylhexyl acrylate, n-octyl acrylate, 2-ethylhexyl acrylate, n-octyl methacrylate, decyl acrylate, decyl methacrylate, lauryl acrylate, stearyl acrylate, lauryl methacrylate, octadecyl acrylate, octadecyl methacrylate, 2-(perfluorohexyl)ethyl acrylate, 2-(perfluorooctyl)ethyl acrylate, 2-(perfluorodecyl) ethyl acrylate, 2-(perfluorohexyl)ethyl methacrylate, 2-(perfluorooctyl)ethyl methacrylate, lauryl methacrylate, stearyl methacrylate, 2-(perfluorodecyl)ethyl methacrylate, 2-(perfluorooctyl)ethyl trichlorosilane and vinyl naphthalene. Among these, the acrylate and methacrylate monomers described above are most preferred.

The curable coating composition also includes b) one or more heat- or UV-activated free-radical initiators. Suitable polymerization initiators include free radical initiators such as, for example, 1) acyl peroxides, such as acetyl or benzoyl peroxides, 2) alkyl peroxides, such as cumyl, dicumyl, lauroyl, or t-butyl peroxides, 3) hydroperoxides, such as t-butyl or cumyl hydroperoxides, 4) peresters, such t-butyl perbenzoate, 5) other organic peroxides, including 1,1-bis (tert-butylperoxy)-3,3,5-trimethylcyclohexane, acyl alkylsulfonyl peroxides, dialkyl peroxydicarbonates, diperoxyketals, ketone peroxides, or 1,1-Bis(tert-butylperoxy)-3,3,5-trimethylcyclohexane, 6) azo compounds, such as 2,2'-azobisisobutyronitrile (AIBN) or 2,2'-azobis(2,4-dimethylpentanenitrile), 4,4'-azobis(4-cyanovaleric acid), or 1,1'-azobis (cyclohexanecarbonitrile), 7) various tetrazines and 8) various persulfate compounds, such as potassium persulfate. Polymerization initiators that are solids at 22° C. are preferred, as are those having a 10 hour half-life at a temperature of 60° C. or more.

The curable coating composition of the invention may also contain one or more of the following optional components:

c) At least one crosslinking monomer having at least two free-radical-curable groups and a boiling temperature of at least 100° C. The boiling temperature preferably is at least 125° C. and more preferably at least 150° C. All boiling temperatures in this specification are at one atmosphere pressure unless otherwise indicated. The crosslinking monomer preferably is a liquid at 22° C. The free-radical-curable polymerizable groups may be as described above with regard to component a), with acrylate or methacrylate groups being preferred. The crosslinking monomers may have, for example 2 to 20, preferably 2 to 8 and more preferably 2 to 6 free-radical-curable groups per molecule. Examples of crosslinking monomers include polyacrylate or polymethacrylate compounds having 2 to 20, preferably 2 to 8 or 2 to 6 acrylate and/or methacrylate groups per molecule. Specific examples include acrylate and/or methacrylate esters of polyols having 2 to 50, 2 to 20 or 4 to 12 carbon atoms, such as 1,4-butanediol diacrylate, 1,6-hexanediol diacrylate, 1,8-octanediol diacrylate, cyclohexane dimethanol diacrylate, trimethylolpropane triacrylate, glycerin triacrylate, pentaerythritol tetraacrylate, dipentaerythritol tetraacrylate, diepentaerythritol hexacrylate, the corresponding methacrylates, and the like. So-called drying oils like linseed oil, safflower oil and tung oil are also useful crosslinkers.

d) One or more free-radical-curable monomers different from components a) and c). Such a monomer may have a boiling temperature of below 100° C. Such a monomer may have exactly one free-radical-polymerizable group, or may have more than one such group, in which case it will function as a cross-linker. Such a monomer may be a liquid or solid at 22° C. The component d) monomer, if present, preferably is copolymerizable with the component a) and c) monomers. Preferred free-radical-polymerizable groups on the component d) monomer(s) are acrylate and methacrylate. Examples of component d) monomers include hexyl acrylate, butyl acrylate, hydroxyethyl acrylate, methyl acrylate, ethyl acrylate, hexyl methacrylate, butyl methacrylate, hydroxyethyl methacrylate, methyl methacrylate, ethyl methacrylate, 2-(perfluorobutyl)ethyl acrylate, 2-(perfluorobutyl)ethyl methacrylate, styrene, ethylene benzene, chlorostyrene, and the like.

e) One or more carriers. Useful carriers or mixture of carriers are liquid at 22° C. or else are materials that are solid at 22° C. but-have a melting temperature of 100° C. or less, preferably 50° C. or less. The carrier preferably also has a boiling temperature of at least 100° C., more preferably at least 125° C. and still more preferably at least 150° C. The carrier contains no free-radical-polymerizable groups. Preferred carriers have water-solubility characteristics as described with respect to the component a) monomers. However, the carrier preferably is soluble in or becomes partially entrained into the polymer formed when the coating composition is cured.

Examples of useful carriers are (i) aliphatic monoalcohols or aliphatic monocarboxylic acids having 14 to 30 carbon atoms; (ii) esters of a fatty acid and a fatty alcohol, the ester having 18 to 48 carbon atoms, preferably 20 to 36 carbon atoms; (iii) a polyether having one or more hydroxyl groups; (iv) a polysiloxane, which can be linear, branched or cyclic; (v) a polysiloxane-poly(alkylene glycol) copolymer; (vi) a wax, such as a polyethylene wax, bees wax, lanolin, carnauba wax, candelilla wax, ouricury wax, sugarcane wax, jojoba wax, epicuticular wax, coconut wax, petroleum wax, paraffin wax and the like, especially one having a melting temperature of greater than 22° C., preferably greater than 35° C. but no greater than 100° C., especially no greater than 50° C.; (vii) a fluoropolymer, (viii) solid vegetable and/or animal oils or fats; (viii) another organic oligomer or polymer having a pure phase melting or softening temperature up to 100° C. or (ix) various plasticizers.

Among the aliphatic monoalcohols are fatty alcohols, including saturated fatty alcohols such as 1-dodecanol, 1-tetradecanol, 1-hexadecanol, 1-octadecanol, and the like, as well as fatty alcohols have one or more sites of carbon-carbon unsaturation in the fatty alcohol chain. Among the useful esters of a fatty acid and a fatty alcohol are, for example, hexyl octadecanoate, octyl octadecanoate, dodecyl octadecanoate, hexadodecyl octadecanoate, and the like. The fatty acid and/or fatty alcohol portions of the ester may contain one or more sites of carbon-carbon unsaturation.

Suitable polyethers are polymers of one or more cyclic ethers such as propylene oxide, tetramethylene glycol and the like. The molecular weight is high enough to produce a polymer having a melting temperature up to 100° C. The polyether may contain one or more hydroxyl groups. It may be linear or branched. The polyether may contain terminal alkyl ester groups. Specific examples of suitable polyethers include poly(ethylene oxide), monoalkyl esters of a poly (ethylene oxide), poly(propylene oxide), monoalkyl esters of a poly(propylene oxide), ethylene oxide-propylene oxide copolymers and monoalkyl esters thereof, poly(tetramethylene oxide) and the like.

Useful polysiloxanes include, for example, poly(dimethyl siloxane) (PDMS) and copolymers thereof. The polysiloxane may be linear, branched or cyclic. Useful siloxane-poly (alkylene glycol) copolymers include, for example, poly (dimethyl siloxane-poly(ethylene glycol) copolymers that can have a block or graft structure.

Organic polymers having melting temperatures below 100° C. that are useful as a component of the carrier or mixture of carriers includes low molecular weight polyamides, low molecular weight polyethers, low molecular weight polystyrene, low molecular weight acrylate polymers and copolymers such as poly (ethylene glycol) methyl ether methacrylate (PEGMEA), polyacrylamide, poly(N-isopropylacrylamide), poly(acrylic acid), low molecular weight thermoplastic cellulose ethers and esters, poly(2-ethylacrylic acid), poly(vinylphosphonic acid), poly(sodium 4-styrenesulfonate), poly(2-ethyl-2-oxazoline) and the like.

Among the plasticizers are phthalate esters, trimellitate esters, adipate esters, maleate esters, benzoate esters, terephthalate esters, various fatty acid esters, epoxidized vegetable oils, sulfonamides, organophosphates, alkyl citrates, acetylated monogylcerides and the like.

The carrier may provide certain functional attributes to the cured composition. In some embodiments, the carrier provides increased hydrophobicity and/or oleophobic properties to the cured composition. It may also perform a plasticizing function.

Especially preferred carriers include polysiloxane oils, waxes and alcohol carriers. Especially preferred polysiloxane oils include octamethylcyclotetrasiloxane, decamethylcyclopentasiloxane, and linear or branched polydimethylsiloxane (PDMS) oil such as hexamethyldisiloxane, octamethyltrisiloxane, decamethyltetrasiloxane, dodecamethylpentasiloxane, polymethylhydrosiloxane (PMHS) oil, and other liquid cyclomethicones. Paraffin or beeswax waxes are especially preferred wax carriers. Stearyl and cetyl alcohol are especially preferred alcohol carriers and are solids at 22° C.

The carrier may also include low molecular weight organic compounds that have boiling temperatures below 100° C., but if such materials are present, they preferably constitute in the aggregate no more than 2 weight percent of the curable composition, and preferably no more than 1 weight percent or 0.25 weight percent thereof. These low molecular weight organic compounds include, for example, liquid polyethers and polyether mono alkyl esters such as PPG-14 monobutyl ester; liquid alkanes such as n-hexane, n-pentane, n-heptane, henicosane, docosane, tricosane, tetracosane, pentacosane, hexacosane, heptacosane, octacosane, nonacosane, triacontane and the like; liquid alcohols such as n-propanol, isopropanol, n-butanol, t-butanol, methanol and ethanol; fluorinated alkanes such as perfluorohexane, perfluoroheptane, perflurodecane-pinane, perfluorodecane-octane, perfluorododecane and the like; chlorinated alkanes and chlorinated aromatic compounds such as isoamyl chloride, isobutyl chloride and benzyl chloride; alkane diols and polyalkylene glycols such as ethylene glycol, propylene glycol, diethylene glycol, triethylene glycol, dipropylene glycol, tripropylene glycol and 1,4-butane diol; liquid esters such as diisopropyl sebacate and glycerol tripalmitate; ketones such as acetone and methyl ethyl ketone; liquid fatty acids such as stearic acid, oleic acid, palmitic acid, lauric acid and the like; 1-naphthalamine; biphenyl; benzophenone; diphenyl amine; 1,2-diphenylethane; maleic anhydride; pyrazine; thymol; glycerin; sorbitol or other sugars; and dibenzylidene sorbitol.

f) One or more finishing attribute chemicals. A "finishing attribute chemical" is a compound, other than the carrier and monomer(s), which remains with the substrate after the treatment process of the invention and imparts some desirable characteristic to the substrate. Examples of finishing attribute chemicals include, for example:

f-1) hydrophobic treatments, i.e., chemicals that impart water-repellency and/or hydrophobic characteristics to the treated substrate;

f-2) oleophobic and lipophobic treatments, i.e., substances that render the treated substrate not readily absorbent to fats and oils, or repellent to fats and oils;

f-3) super-hydrophobicity agents; i.e., substances that impart very high)(>130° contact angles of a water droplet with a surface of the treated substrate. The super-hydrophobicity agent may include solid particles sized from 50 nm to 100 microns such as powdered fluorocarbon polymer powders. Other super-hydrophobicity agents include chlorinated or fluorinated silicone compounds such as heptadecafluorodecyltrimethoxysilane, trimethoxy(1H, 1H, 2H, 2H-heptadecafluorodecyl)silane, octadecyldimethylchlorosilane, tris(trimethylsiloxy)silylethyldimethylchlorosilane, octyldimethylchlorosilane, dimethyldichlorosilane, butyldimethylchlorosilane and trimethylchlorosilane.

f-4) Particulate solids that perform functions such as wicking agents, fillers, water scavengers, coloring agents, flame retardants, abrasives, rheology modifiers, and the like. Such particulate solids include, for example, silica gel particles, fumed silica, hydrophobic fumed silica, glass or other ceramic particles, polystyrene particles, polytetrafluoroethylene particles, poly(vinyl fluoride) particles, poly(vinylidene fluoride) particles, poly(hexafluoropropylene particles, poly(perfluoropropylvinylether) particles, poly(perfluoromethylvinylether) particles, poly(chlorotrifluoroethylene) particles, polypropylene microspheres, mineral powders such as talc, iron carbonate and calcium carbonate, and flame retardant minerals, such as calcium carbonate, aluminum hydroxide, magnesium hydroxide, various borates, boron and/or phosphorous compounds and inorganic hydrates, titanium carbide, tungsten carbide, pumice, silicon carbide, zirconia alumina.

f-5) antimicrobial treatments, i.e., substances that inhibit microbial growth and/or kill microorganisms, including Cu, Zn, Ag compounds, and chitosan particles.

f-6) UV absorbers and/or UV reflectors such as avobenzone, rutile titanium dioxide, silicon dioxide, homosalate, oxybenzone, 4-aminobenzoic acid (PABA), octisalate, octocylene, 2-ethylhexyl 4-dimethylaminobenzoate and the like;

f-7) Colorants such as dyes and pigments. These include acid dyes, reactive dyes, and disperse dyes.

f-8) Wrinkle-resisting agents, such as melamine-formaldehyde resins and urea-formaldehyde resins;

f-9) Fabric softeners and anti-chafing agents, such as polydimethylsiloxane and polymethylhydrosilane;

f-10) Light and/or heat-reflecting materials such as reflective metal particles, titanium dioxide or ZnO particles and the like.

f-11) Emollients which create, for example, softness, wear comfort and/or moisturizing properties.

f-12) Insecticides and/or insect repellants, such as metofluthrin, transfluthrin, dichlovos, permethrin, thyme oil, rosemary oil, citronella oil, cinnamon bark oil, lemon eucalyptus oil, lemongrass oil, and cedar wood oil.

f-13) Solid or liquid flame retardants, including various organophosphorous, phosphorous-containing, bromine-containing and boron-containing compounds including sodium tetraborate and boric acid.

f-14) Trace forensic chemical markers that are added to the formulation to help detect counterfeit goods or counterfeit finishing treatment. Such markers may contain rare earth elements, such as yittrium, scandium, cerium, europium or erbium, or other elements not normally found in textiles, or compounds that provide detectable fluorescence when exposed to ultraviolet light.

The chemical treatment mixture may also include g) one or more promoters or activators for a polymerization initiator. Metal salts such as iron, titanium or vanadium salts and manganese ions or manganese are examples of such promoters.

The chemical treatment mixture may further contain h) one or more blowing agents. Suitable blowing agents include physical (endothermic) types which are liquids at 22° C. but volatilize under the conditions of the curing step, and physical types which decompose or otherwise react under the conditions of the curing reaction to form a gas. If an organic physical blowing agent is present, it should be used in small amounts such that the curable composition contains no more than 10%, preferably no more than 5%, more preferably no more than 2% and still more preferably no more than 1%, even more preferably no more than 0.25% by weight of organic compounds having a boiling temperature of less than 100° C. Chemical blowing agents preferably generate carbon dioxide or nitrogen; these include the so-called azo types, peroxy blowing agents such as peroxyesters, peroxycarbonates and the like, and certain carbamate and citrate compounds.

The selection of the various ingredients of the curable coating composition, their proportions and the manner of preparing the composition are all made such that the coating composition is a liquid at 22° C. or a suspension of one or more solids in a liquid phase at 22° C. and at standard pressure, and the coating composition contains no more than 10% by weight of organic compounds that have boiling temperatures below 100° C. and no more than 5% by weight water, based on the entire weight of the coating composition. The curable coating composition preferably contains no more than 5%, more preferably no more than 2%, still more preferably no more than 1%, and even more preferably no more than 0.25% by weight of organic compounds that have boiling temperatures below 100° C., and no more than 2%, more preferably no more than 1% and still more preferably no more than 0.25% by weight of water.

The curable coating composition may contain, for example at least 1, at least 5, at least 10 or at least 25 weight percent of compounds that have a vapor pressure (at one atmosphere pressure) of 1 to 67 kPa, preferably 6.7 to 53 kPa, at the temperature of the polymerization step 4).

Component a) monomers (and component c) monomers, if present) may together constitute, for example, 0.5 to 100%, of the weight of the curable composition. In some embodiments, the component a) and c) monomers together constitute at least 1%, at least 1.5%, at least 2%, at least 5%, at least 10%, at least 25% or at least 40% of the weight of the curable coating composition. Components a) and c) together may constitute up to 90%, up to 80%, up to 70%, up to 60%, up to 50%, up to 40%, up to 25%, up to 10% or up to 5% of the weight of the curable coating composition. Component c) in some embodiments constitutes 5 to 50%, 10 to 40%, 10 to 30% or 15 to 25% of the combined weight of components a) and b).

Component d) monomers, if present, may constitute up to 50% of the weight of the curable composition, provided that if the component d) monomer has a boiling temperature of less than 100° C., then it is present in an amount such that the curable composition contains no more than 2% by weight of organic compounds having a boiling temperature of less than 100° C. A preferred amount, if any are present, is 0.01 to 25% by weight, or 0.01 to 10%, of the weight of the curable coating composition if the component d) monomer boils below 100° C. In some embodiments, component d) monomers, if present at all, constitute up to 5%, up to 2% or up to 1% of the combined weight of components a), b) and c)

Polymerization initiators such as free radical initiators may constitute up to 20% of the weight of the curable composition. A preferred amount is 0.1 to 10% by weight. A more preferred amount is 2-5% by weight of the curable composition. In some embodiments, the polymerization initiator(s) is present in an amount of up to 30% of the combined weight of components a), c) and d), such as 3 to 20% or 5 to 15% thereof.

The carrier or mixture of carriers, if present, may constitute, for example, 2 to 98%, of the weight of the curable composition. Carriers that are solid at 22° C. preferably are present in amounts of up to 150% of the weight of monomers (i.e., components a), c) and d). Such solid carriers in some embodiments are present in an amount of at least 10%, at least 20% or at least 30% of the weight of monomers, and up to 150%, up to 125% or up 100% on the same basis. Waxes (carrier type (vi) above) in particular are preferably present in amounts as indicated in the previous sentence.

Liquid (at 22° C. and at atmospheric pressure) carriers may perform a dilution function and therefor in some embodiments may constitute as much as 98 weight-% of the curable composition, or a low as about 2 weight-% thereof. In specific embodiments, the curable composition may contain at least 5 weight-%, at least 10 weight-%, at least 25 weight-%, at least 40 weight-%, at least 50 weight % or at least 70 weight-% of one or more liquid carriers. It may contain up to 96 weight-%, up to 90 weight-%, up to 75 weight-%, up to 50 weight-%, up to 35 weight-%, up to 25 weight-% or up to 10 weight-% in specific embodiments Finishing attribute chemicals, when present, may in the aggregate constitute from 0.01 to 70%, preferably 0.01 to 25% and more preferably 0.01 to 10% of the weight of the curable composition. Forensic markers may be even lower, in the 1-1000 ppm level.

Other materials may in the aggregate constitute 0.01 to 70%, preferably 0.01 to 50%, more preferably 0.01 to 25%, and still more preferably 0.01 to 10%, of the weight of the curable composition.

A preferred curable composition contains 4 to 85% of component a), 2 to 25% of component c), 10 to 70%, more preferably 15 to 50%, of one or more carriers, and 0 to 35%, preferably 1 to 25% of one or more functional attribute materials. Another preferred curable composition contains 16 to 70% of component a), 3 to 20% of component c), 25-50% of one or more carriers, and 0 to 35%, preferably 1 to 25% of one or more functional attribute materials. Such preferred curable compositions contain 1 to 10 weight percent of one or more free-radical initiators. In some embodiments of such preferred curable compositions, component a) includes one or more acrylate or methacrylate monomers; component c) includes one or more monomers having 2 to 6 acrylate or methacrylate groups, component c) if present, includes one or more fatty acid acrylate compounds, and component e) includes one or more of a wax and a silicone oil.

A third preferred curable composition contains 1 to 75% of component a) and c) combined, wherein component c) constitutes 15 to 85% of the combined weights of components a) and c); 2 to 98% of one or more carriers, and 0 to 35%, preferably 1 to 25% of one or more functional attribute materials. In this preferred curable composition, the carrier preferably includes at least one liquid carrier and at least one solid (at 22° C.) carrier, and the solid carrier is preferably present in an amount of 10 to 150 weight-percent based on monomers (components a), c) and d). A fourth preferred curable composition contains 1 to 60% of components a) and c) combined, where component c) constitutes 20 to 65% of the combined weights of components a) and c), 30 to 100%, based on the weight of monomers, of one or more solid carriers, 2-98 weight-% of one or more liquid carriers, and 0 to 35%, preferably 1 to 25% of one or more functional attribute materials. These third and fourth preferred curable compositions preferably contains 3 to 20 or 5 to 15 weight percent of one or more free-radical initiators, based on the weight of monomers. In some embodiments of such third and fourth preferred curable compositions, component a) includes one or more acrylate or methacrylate monomers; component c) includes one or more monomers having 2 to 6 acrylate or methacrylate groups, component d) if present, includes one or more fatty acid acrylate compounds, and component e) includes one or more of a wax and a silicone oil.

An especially preferred curable composition (including the preferred compositions just described in the preceding two paragraph) includes at least one solid (at 22° C.) component a) monomer and at least one liquid (at 22° C.) component a) monomer. The solid component a) monomer(s) may constitute 20-85% or 20 to 65% of total weight of all component a) monomers. In such a composition, the solid component a) monomer may include a fatty acid acrylate in which the fatty acid group contains 18 or more carbon atoms, and the liquid component a) monomer may be a fatty acid acrylate in which the fatty acid group contains up to 16 carbon atoms and/or a fatty acid methacrylate in which the fatty acid group contains up to 18 carbon atoms. Such an especially preferred curable composition may contain 3-20% of component c). The component c) material in such a composition may include one or more of an alkane diol diacrylate, a pentaerythritol or dipentaerythritol polyacrylate and a drying oil such as linseed, safflower or tung oil. This especially preferred curable composition may contain 20-50% of component e), where component e) preferably includes at least one of a fatty alcohol, a wax and a silicone oil. This especially preferred curable composition may optionally contain 1-25% of at least one finishing attribute chemical, and may contain up to 2% of a component d) monomer (if any at all).

The following examples are intended to illustrate the invention but not to limit the scope thereof. All parts and percentages are by weight unless otherwise indicated.

EXAMPLE 1

A loosely-woven para-aramid fabric as is used in ballistic protection apparel is used as the substrate in this example. The presence of water inside aramid fiber is believed to weaken the fiber.

A curable, monomer-based composition containing by weight 30% octadecyl acrylate, 18% paraffin, 9% 1,6-hexanediol diacrylate, 8% lauryl acrylate, 3% dipentaerythritol penta-/hexa acrylate, 5% lauroyl peroxide and 27% decamethylcyclopentasiloxane is mixed and then diluted 1:2 with polydimethylsiloxane (5 centistokes) to make a curable coating composition containing monomers that are free radical polymerizable and having a boiling temperature above 100° C. with a thermally-activated polymerization initiator. Two identical swatches of 8.5"×8.5" aramid fabric are coated by dipping them into this coating composition and then squeezing out the excess liquor between two pressurized rollers.

The weight of the coating applied to the first swatch (Example 1) is 26.1 g/m². The coating is cured as follows: nitrogen gas is flowed through the autoclave at room temperature and 1 atmosphere pressure to purge molecular oxygen until the gas in the autoclave contains less than 0.1 mole-percent oxygen. The autoclave is then sealed, pressurized to 1.4 MPa with nitrogen, and then heated to 121° C. for 40 minutes to activate the polymerization initiator and cure the composition. The post-cure coating additive weight of the sample cured at elevated pressure is identical to the pre-cured weight and is unchanged at 26.1 g/m².

The weight of the coating applied to the second swatch (Comparative Sample A) is 33.7 g/m². This coating is cured by purging molecular oxygen in the same manner as Example 1, and then curing at 121° C., but during the curing step the pressure is one atmosphere pressure and the vessel is not sealed, so gasses in the reactor can freely exhaust to air. The post-cure weight addition of the sample cured at atmospheric pressure is significantly lower only 22.7 g/m², or only about two-thirds of the weight of the uncured coating as applied.

Both swatches are then evaluated according to the 10 minutes Bundesmann water repellency test. The water weight gained by Example 1 in this test is 6.95%, and water penetration through the coated sample is 16 mL. By contrast, the water weight gain of Comparative Sample A is 11.97% and the water penetration through this sample is 30 mL. By pressurizing and curing under pressure in a sealed vessel, both the water weight gain and the water penetration are reduced by nearly half.

EXAMPLE 2

Two swatches of a tightly woven sports apparel fabric that consists of 63% nylon, 25% polyester and 12% Lycra are dip coated with a curable coating composition and squeezed out between pressurized rollers as described in Example 1. The first swatch (Example 2) is cured in a high pressure vessel at 1.4 MPa and at 125° C. for 40 minutes. It has a cured coating weight of 14.140 g/yd². The other swatch (Comparative Sample B) is coated twice and then cured at the same temperature in a nitrogen atmospheric at atmospheric pressure in an unsealed reactor. Comparative Sample B has a cured coating weight of 23.360 g/yd². Despite the much higher coating weight of Comparative Sample B, it achieves only a "70" spray rating on the AATCC 22 Spray Test, wherein the lower coating weight used in Example 2 achieves a perfect "100" spray rating.

EXAMPLE 3

A tightly-woven 100% polyester fabric that is used as the outer layer of a laminated polyester/poly-urethane membrane fabric is coated using the same mixture used in Example 1. Two samples are coated in the same way and same dose. One (Example 3) is cured in the manner described with respect to Example 1, at a curing temperature of 126° C. The other (Comparative Sample C) is cured in the same manner, but at atmospheric pressure. Example 1 achieves a perfect "5" rating on the Bundesmann water repellency test and gains only 2.53% water weight. Comparative Sample C achieves a lower "4" rating and gains 6.32% water. There is no detectable water penetration through either of these tightly woven samples in the Bundesmann test.

EXAMPLES 4 AND 5

Duplicate samples of tightly-woven acrylic fabric commonly used for outdoor furniture upholstery are coated with equal dosages of a curable coating composition as described in Example 1. Similarly, duplicate samples of an acrylic awning fabric are coated with the same composition. Cured coating weights are as indicated in the table below. Cured coating weights are determined by comparing the weight of the sample after curing with the weight of the uncoated sample.

In each case, one of the samples (Examples 4 and 5, respectively) are cured at 125° C., in the same manner as described with respect to Example 1. The duplicate samples (Comp. Samples D and E, respectively) are cured in the same manner, except at atmospheric pressure. The samples are then evaluated using the AATCC 22 Spray test, with results as indicated in the following table 1.

TABLE 1

| Designation | Substrate type | Curing pressure, MPa | AATCC test rating | % water gain, AATCC test | Coating weight, g/sq. yard |
| --- | --- | --- | --- | --- | --- |
| Ex. 4 | Acrylic Upholstery | 1.4 | 100 | 0 | 73 |
| Comp. D | Acrylic Upholstery | 0.09 | 80 | 2.1 | 49.6 |
| Ex. 5 | Acrylic Awning | 1.4 | 100 | 0 | 72.1 |
| Comp. E | Acrylic Awning | 0.09 | 60 | 2.3 | 49.2 |

As shown in Table 1, curing under superatmospheric pressure leads to a significant improvement in AATCC rating and less water gain for both fabrics. Surprisingly, the coating weight in the cured samples is significantly higher than in Examples 4 and 5 than with the comparative samples, despite having nearly the same pre-cure weight addition. This suggests a significant amount of the curing composition is volatilizing at the lower pressures of the comparative samples.

EXAMPLE 6

Three samples of para-aramid fabric as described in Example 1 are pre-cleaned to remove organic contaminants. One sample is coated with a 1:1 by volume mixture of the coating composition described in Example 1 and trimethoxy (1H,1H,2H,2H-heptadecafluorodecyl)silane. The second is coated with a 1:1 mixture of the Example 1 coating composition and perfluorohexyl ethyl acrylate.

The third sample is cleaned like the other two, but is then sprayed with a 1:5 dilution of $TiCl_3$ isopropyl alcohol and was allowed to dry. This provides a Ziegler-Natta catalyst presence on the sample. That sample then coated with a 1:1 by volume mixture of the Example 1 composition and perfluorooctyl ethylene.

The coated samples are then cured as described in Example 1, at a curing temperature of 125° C. The cured samples are tested for oleophobicity according to the AATCC 118 hydrocarbon repellency test. All three exhibit the highest ("8") rating, indicating repellence to both water and n-heptane.

When duplicate samples of all three types are cured at atmospheric pressure, they demonstrate little or no oleophobicity and are only water repellent.

EXAMPLE 7

A computer circuit peripheral is painted with the hydrocarbon monomer mixture consisting of 36% octadecyl acrylate, 11% 1,6-hexanediol diacrylate, 9% lauryl acrylate, 5% dipentaerythritol penta-/hexa acrylate, 4% lauroyl peroxide and 35% decamethylcyclopentasiloxane, which is then diluted 1:2 with 5 cSt polydimethylsiloxane. The painted substrate is then placed in a vessel, the vessel is purged of oxygen by flowing nitrogen through the vessel and the coating is cured in an oxygen deficient nitrogen environment at 1.4 MPa and at a temperature of 126° C. When removed from the pressure vessel, it is seen that the coating has hardened and has been pushed between and under the electronic components and even into the metal contact vias, effectively sealing the device. The coating is water repellent and survives the addition of several water drops placed onto the device. A moisture-sensitive marker button used to reveal the presence of water remains untriggered, even when a water droplet is placed directly onto the coating above it.

EXAMPLES 8 AND 9

Four swatches of a 100% polyester fleece product that does not contain a wicking agent are treated using a monomeric coating that produces a hydrophilic finish. A fifth swatch is left untreated as a control.

Two of the swatches are roll coated on the smooth face side with a 5:4:1 by volume mixture of acrylic acid, decamethylcyclopentasiloxane and 1,1-bis(tert-butylperoxy)-3, 3,5-trimethylcyclohexane. Of these, one (Example 8) is placed in an autoclave, purged with nitrogen and then cured under nitrogen at 1.48 MPa and 125° C. in the sealed autoclave. The other (Comparative Sample F) is cured under atmospheric pressure nitrogen at the same temperature. Example 8 and Comparative Sample F each have approximately equal "wet" coating weights, but after curing the coating weight of Example 8 is 6.35 $g/m^2$ whereas that of Comparative Sample F is only 1.9 $g/m^2$.

Two other samples are prepared by roll coating a 5:4:1:1 by volume mixture of acrylic acid, decamethylcyclopentasiloxane, 1, 1-bis(tert-butylperoxy)-3, 3,5-trimethylcyclohexane and ethylene glycol dimethacrylate on the face side. One of these (Example 9) is placed in an autoclave, purged with nitrogen, and then is cured under nitrogen at 1.48 MPa and at 125° C. in the sealed autoclave. The other (Comparative Sample G) is cured under atmospheric pressure nitrogen at 125° C., with the autoclave unsealed. Example 9 and Comparative Sample G each have approximately equal "wet" coating weights, but after curing the coating weight of Example 9 is 10.6 $g/m^2$ whereas that of Comparative Sample G is only 2.1 $g/m^2$.

The control sample and Comparative Samples F and G exhibit no hydrophilicity: a water drop applied to the fabric does not soak in even after more than 1 minute. Examples 8 and 9 exhibit immediate hydrophilicity, allowing an applied droplet to soak in in less than 2 seconds.

EXAMPLE 10

A fully finished, 100% polyester athletic shirt having a conventionally-applied wicking finish (i.e., a droplet of water applied to the shirt fabric immediately wicks into the fabric) is treated for hydrophobicity by placing it on a mannequin and spraying 36 mL of the curable monomer coating of Example 1 on the shirt with a high volume low pressure paint sprayer. All sides of the shirt are sprayed on the outside only, including the sewn seams, collar and half-sleeves. The sprayed shirt is loosely placed into an 18 L steam autoclave containing 2.5 liters of distilled water. The autoclave is first purged of oxygen using a flow of dry nitrogen and then steam generation is initiated using an electrical immersion heater. The autoclave has a pressure relief value that allows steam to escape when the pressure exceeds 150 kPa gauge. The equilibrium temperature of the steam at this pressure is 126° C. No nitrogen is present during product curing, as the steam displaces any residual nitrogen (or air) in the volume.

The treated shirt is heated at 0.15 MPa and 126° C. for 20 minutes, then the power is turned off and the unit allowed to cool and return to atmospheric pressure. After curing, the shirt is fully hydrophobic, indicating that the wicking agent originally present had been overcome by the polymer treatment. The cured polymer dose is estimated at 36 $g/m^2$. Laundry durability testing combined with the AATCC 22 spray test indicates that perfect water repellency (spray rating of 100 on the AATCC 22 spray test) is maintained after 80 home laundry wash/dry cycles.

EXAMPLE 11

Three swatches of tightly woven, 100% polyester designed for outerwear rain protection are prepared for treatment and testing in a Bundesmann water repellency tester. One sample is untreated and functions as the control (Comparative Sample H). The other samples are coated using the coating composition made by diluting the composition described in Example 1 with 5 cSt PDMS at a 1:2 volume ratio. The coating is done by immersing the samples in the liquid formulation and then squeezing out excess liquid between two metal rollers. One of the coated samples (Example 11) is placed into a pressure vessel, which is purged with nitrogen and then subsequently pressurized with nitrogen to 1.48 MPa and then heated to 125° C. to cure the coating. The other coated sample (Comparative Sample I) is cured under atmospheric pressure nitrogen at 125° C. All three samples are evaluated for 10 minutes in the Bundesmann tester with the results as indicated in Table 2. The visual rating is visually scored from 1 to 5 (with 5 being best). The % water weight addition is the amount of water weight gained by the sample during the test. Water penetration is the amount of water that passes through the sample, with the minimum detectable amount being <1 mL.

TABLE 2

| Designation | Coating weight before curing, g/m² | Coating weight after curing, g/m² | Bundesmann Test Results | | |
| --- | --- | --- | --- | --- | --- |
| | | | Visual Rating | Water weight added, % | Water penetration, mL |
| Comp. H | NA | NA | 1 | 34.45 | 125 |
| Comp. I | 25.2 | 19.06 | 3.5 | 8.73 | <1 |
| Ex. 11 | 28.3 | 20.65 | 3.5 | 4.65 | <1 |

As seen from the results in Table 3, the untreated control wets completely. Example 11 and Comparative Sample I both prevent essentially any water from penetrating the sample, but Example 11, in which the curing is performed under high pressure, absorbs about 50% less water than Comparative Sample I, which is cured at atmospheric pressure.

EXAMPLE 12

Membrane fabrics include a thin, moisture vapor permeable membrane, such as polyurethane or PTFE. The membrane is moisture permeable because it is very thin and slightly porous on a microscopic level. Because the membrane is so thin, it must be protected by sandwiching it in between two other layers of fabric. Typically, there is a soft bottom fabric that protects the membrane from rubbing by the skin or other clothing, and a face fabric that serves to protect the membrane from any external abrasion, and for the cosmetic appearance of the garment. The top, face fabric must be treated with a water-repellent finish, so that rainwater is rapidly shed from the garment to avoid "wetting out". If such water saturation of the face fabric happens, then moisture vapor from the body cannot escape through the membrane because it is diffusion blocked by the wetted fabric. Accordingly, it is desirable for the face fabric to be as water repellent as possible, even in intense rain showers.

Multiple samples of a 3-layer membrane fabric having a central PTFE membrane are coated on the top, face fabric and cured using in the general procedure described in Example 1. After coating and purging the fabrics are pressurized under an oxygen-deficient atmospheres to either 250 psig (1.7 MPa) or 450 psig (3.1 MPa) pressure and cured at that pressure at 90° C. for 15 minutes. The coated fabric is evaluated for water repellency according to the ISO 9865 testing protocol, for 10 minutes in a Bundesmann water repellency tester. The sample cured at 1.7 MPa pressure achieves a 4.7 water repellency rating. It gains 15.4% of water weight, and no water penetrates the sample. The sample cured at 3.1 MPa pressure achieves a perfect 5 water repellency rating and gains only 5.7% of water weight. No water passes through that sample, either. In these experiments, higher pressure during curing clearly improves the results.

EXAMPLES 13 AND 14

Duplicate samples of an aramid fabric having a surface lubricant are coated in accordance with the general procedure described in Example 1, except that curing is performed at 135° C. and 1.7 MPa gauge pressure.

One sample is coated without pretreatment. On the ISO 9865 test, the coated sample gains 20-25% water weight.

A second sample (Example 13) is subjected to an oxidative pretreatment by heating it to 150° C. at 50 psi (345 kPa) pure oxygen for 15 minutes. After coating, the sample gains only 2.9% water weight. This result is comparable to further comparative samples in which the lubricant is removed by water washing (3.5% water weight gained) and plasma treating (2.5% water weight gained).

A third sample (Example 14) is subjected to an oxidative pretreatment by heating it to 190° C. at 50 psi (345 kPa) pure oxygen for 15 minutes. After coating, the sample gains only 0.9% water weight, which is significantly improved compared to any of the controls.

What is claimed is:

1. A method for applying and curing an organic polymer coating onto a substrate comprising the steps of:
    1) under non-polymerizing conditions, applying a curable coating composition that at 22° C. and at atmospheric pressure is a liquid or a suspension of one or more solids in a liquid phase to at least one surface of the substrate, wherein the curable coating composition contains i) one or more polymerizable organic monomer(s) that polymerizes in the presence of free radicals, has exactly one free-radical-polymerizable group per molecule and has a boiling temperature of at least 100° C. at one atmosphere pressure, and 2) one or more heat-activated polymerization initiator(s), which curable composition contains no more than 10% by weight of organic compounds that have boiling temperatures below 100° C. at one atmosphere pressure and no more than 5% by weight water, based on the entire weight of the coating composition; then
    2) under non-polymerizing conditions, purging molecular oxygen from the interior of a vessel containing the substrate with the applied curable coating, then
    3) during and/or after step 2), pressurizing the purged vessel containing the substrate with the applied curable coating with an oxygen-deficient gas to a gas pressure of at least 120 kPa actual, and then, without exposing the substrate with applied curable coating to an atmosphere containing 1 mole-percent or more oxygen,
    4) at least partially curing the curable coating composition by heating the substrate with the applied curable coating composition under oxygen-deficient conditions to a temperature sufficient to activate the heat-activated polymerization initiator and initiate polymerization of the at least one polymerizable organic monomer, to form an at least partially cured organic polymer coating on the substrate.

2. The process of claim 1, wherein in step 4) the oxygen-deficient conditions include an oxygen-deficient atmosphere having a pressure of at least 120 kPa actual.

3. The process of claim 1, wherein in step 4) the oxygen-deficient conditions include immersion of the substrate with the applied coating composition in a liquid or supercritical fluid.

4. The method of claim 1, wherein step 4) is performed until the conversion of monomer(s) is at least 85 mole-percent.

5. The method of claim 1, wherein step 2) includes a step of flowing an oxygen-deficient gas into contact with the substrate.

6. The method of claim 1, wherein step 2) includes a step of performing at least one pressurization/depressurization cycle in which in each cycle the interior of the vessel containing the coated substrate is pressurized to superatmospheric pressure of at least 120 kPa actual with an oxygen-deficient gas and then depressurized.

7. The method of claim 1, wherein the substrate is a fibrous textile or nonwoven or filler material having interstitial spaces between intersecting fibers.

8. The method of claim 7, wherein the textile or nonwoven includes knitted, woven, tufted, knotted, matted and/or entangled fibers and the textile prior to coating has an air permeability of at least 0.2 feet per minute per square foot (0.001016 m/s) as measured according to ASTM D737.

9. The method of claim 1, wherein step 2) includes a step of compressing the coated substrate to remove molecular oxygen from void spaces in the substrate.

10. The method of claim 1, wherein curable coating composition further comprises at least one crosslinking monomer having at least two free-radical-curable polymerizable groups and a boiling temperature equal to or greater than 100° C.

11. The method of claim 1, which further comprises, prior to step a) step 1), subjecting the substrate to an oxidative pretreatment step.

12. The method of claim 11, wherein said oxidative pretreatment step includes heating the substrate to 100 to 220° C., under an oxygen-containing atmosphere at a superatmospheric pressure.

13. The method of claim 11, wherein said oxidative pretreatment step includes exposing the substrate to an oxygen-containing atmospheric plasma.

14. The method of claim 2, wherein the oxygen-deficient atmosphere includes at least 98 mole-percent nitrogen and up to 0.1 mole-percent molecular oxygen, with the remainder being trace gases that are gases at room temperature and 1 atmosphere pressure.

15. The method of claim 2, wherein the oxygen-deficient atmosphere includes at least 98 mole-percent steam and up to 0.1 mole-percent molecular oxygen, with the remainder being trace gases that are gases at room temperature and 1 atmosphere pressure.

16. The method of claim 2 wherein said oxygen-deficient atmosphere includes at least gas-phase, polymerizable monomer that has a boiling temperature of 40° C. or less at one atmosphere pressure and one or more polymerizable carbon-carbon double bonds.

* * * * *